US012650453B2

(12) United States Patent
Werner et al.

(10) Patent No.: US 12,650,453 B2
(45) Date of Patent: Jun. 9, 2026

(54) EMC SCATTERING APPARATUS

(71) Applicant: International Business Machines Corporation, Armonk, NY (US)

(72) Inventors: John S. Werner, Fishkill, NY (US); Arthur J. Higby, Cottlekill, NY (US); Samuel R. Connor, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 391 days.

(21) Appl. No.: 18/360,156

(22) Filed: Jul. 27, 2023

(65) Prior Publication Data

US 2025/0035691 A1    Jan. 30, 2025

(51) Int. Cl.
*G01R 29/08*      (2006.01)
*G01R 31/00*      (2006.01)

(52) U.S. Cl.
CPC ..... *G01R 29/0871* (2013.01); *G01R 29/0821* (2013.01); *G01R 31/002* (2013.01); *G01R 31/00* (2013.01)

(58) Field of Classification Search
CPC ............ G01R 29/0871; G01R 29/0821; G01R 31/002; G01R 27/2605; G01R 31/2825; G01R 31/2837; G01R 31/2839; G01R 31/00
USPC .......................................... 324/612
See application file for complete search history.

(56) References Cited

U.S. PATENT DOCUMENTS

| | | | |
|---|---|---|---|
| 6,680,847 B2 | 1/2004 | Heard | |
| 9,596,896 B2 | 3/2017 | Coza | |
| 11,129,311 B1 | 9/2021 | Chia | |
| 2002/0040466 A1* | 4/2002 | Khazei | G06F 30/367 |
| | | | 716/115 |
| 2006/0011369 A1* | 1/2006 | Gilliland | H05K 1/023 |
| | | | 174/382 |
| 2013/0154766 A1* | 6/2013 | Beck | H03H 1/0007 |
| | | | 333/182 |
| 2014/0060885 A1 | 3/2014 | Ardisana, II | |
| 2015/0055288 A1 | 2/2015 | Zhang | |
| 2015/0201531 A1 | 7/2015 | Hilburn, Sr. | |
| 2022/0326166 A1* | 10/2022 | Hoghoj | G21K 1/06 |
| 2024/0248050 A1* | 7/2024 | Hoghoj | G01N 23/20008 |

FOREIGN PATENT DOCUMENTS

| | | |
|---|---|---|
| CN | 203136429 U | 8/2013 |
| CN | 207733184 U | 8/2018 |
| CN | 108003771 B | 5/2020 |
| CN | 214616242 U | 11/2021 |
| KR | 200391057 Y1 | 8/2005 |

* cited by examiner

*Primary Examiner* — Raul J Rios Russo

(74) *Attorney, Agent, or Firm* — Scott Dobson

(57) ABSTRACT

An electromagnetic compatibility (EMC) scattering apparatus comprising an attachment component, a scattering cape, and a brace. The attachment component is configured to permit the EMC scattering apparatus to attach to a second object such as a drawer, cable outlet, cable connector, etc. The scattering cape is attached to the attachment component and is configured to scatter energy emitted from the second object by fluttering in response to airflow from the second object. The brace is connected to the attachment component, the brace is configured to keep the scattering cape in an extended position. The brace can also be attached to the scattering cape.

20 Claims, 9 Drawing Sheets

100

105

115

110

100

205

115

100

205

115

110

600

EMC SCATTERING APPARATUS

BACKGROUND

The present disclosure relates to electromagnetic compatibility (EMC), and more specifically, to providing EMC compliance in a product without having to redesign the end product.

Electromagnetic Compatibility or EMC refers to the ability of electronic devices, equipment, and systems to operate properly in the presence of electromagnetic interference (EMI) and without causing interference to other nearby devices. Electromagnetic interference occurs when electromagnetic energy emitted by one device disrupts the operation of another device. This interference can lead to malfunctions, data corruption, communication errors, or even complete system failures. It can be caused by various sources such as power lines, radio waves, wireless devices, motors, etc.

EMC is crucial for computer equipment because computers and related devices generate and are susceptible to electromagnetic emissions. Computers contain numerous electronic components and interconnected circuits that can emit electromagnetic radiation or be affected by it. Without proper EMC design and testing, computer equipment can experience various problems.

For example, electromagnetic interference can disrupt the normal operation of computer equipment, leading to crashes, errors, and data loss. Ensuring EMC helps maintain the reliable functioning of the equipment.

In another instance, such as in a data center, there are many computer systems and devices that operate in close proximity to each other. In the absence of EMC, one device may interfere with the operation of another, causing compatibility issues and disruptions.

Furthermore, most countries have regulations and standards related to EMC to ensure that electronic devices don't cause harmful interference to other equipment or public services. Compliance with these regulations is mandatory for manufacturers to legally sell their products.

EMC is also important for the safety of computer equipment and the users. Malfunctions or interference caused by electromagnetic emissions could potentially pose risks of electric shock, fire, or other hazardous situations.

To achieve EMC, manufacturers employ various design techniques, shielding, grounding, filtering, and testing procedures. These measures help minimize the generation and susceptibility of electromagnetic emissions, ensuring that computer equipment can operate reliably and without causing interference to other devices.

SUMMARY

According to embodiments of the present disclosure, an electromagnetic compatibility (EMC) scattering apparatus comprising an attachment component, a scattering cape, and a brace is disclosed. The attachment component is configured to permit the EMC scattering apparatus to attach to a second object such as a drawer, cable outlet, cable connector, etc. The scattering cape is attached to the attachment component and is configured to scatter energy emitted from the second object by fluttering in response to airflow from the second object. The brace is connected to the attachment component, the brace is configured to keep the scattering cape in an extended position. The brace can also be attached to the scattering cape.

According to embodiments of the present disclosure, a method for operation of an electromagnetic compatibility (EMC) scattering apparatus is disclosed. The method begins by attaching the EMC scattering apparatus to a product in an area clear of obstructions. Next the fans on the product are enabled. This causes airflow to flow through the cape. In response to the airflow, the scattering cape of the EMC scattering apparatus flutters so as to scatter energy emitted from the product. The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1A:
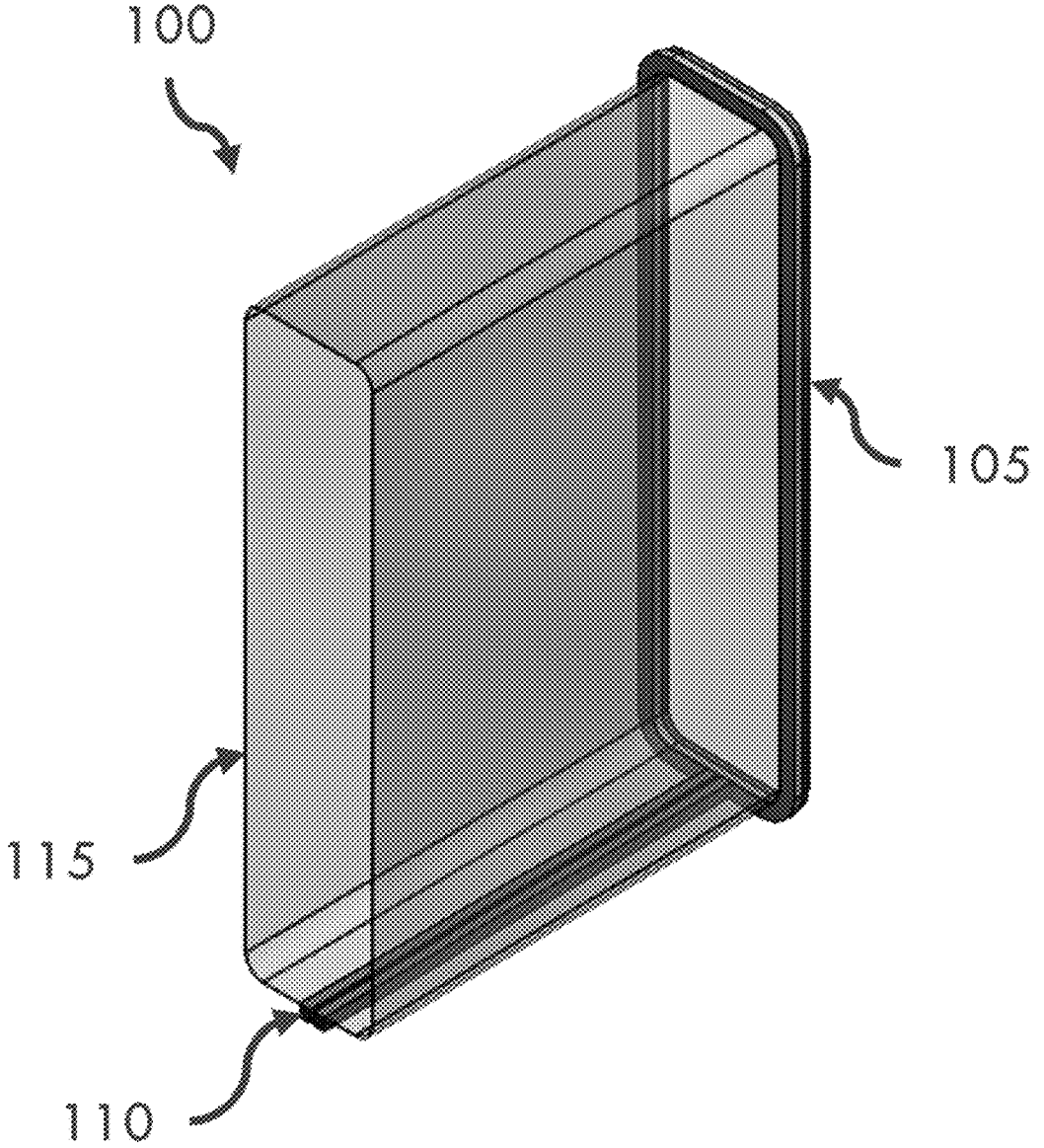
FIG. 1A is a perspective view of an EMC scattering apparatus according to embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to electromagnetic compatibility (EMC), more particular aspects relate to providing EMC compliance in a product without having to redesign the end product. While the present disclosure is not necessarily limited to such applications, various aspects of the disclosure may be appreciated through a discussion of various examples using this context.

Servers and server subcomponents are required to meet a set of international and country specific electromagnetic compatibility (EMC) standards before they can be offered to customers. These standards include, for example, CISPR 22 and CISPR 32 from the International Special Committee on Radio Interference, EN 55024, EN 55032, EN 61000-3-11, and EN 61000-3-12 of the European Union, FCC 47 CFR Part 15—Subpart B of the United States, etc. These standards ensure that electrical equipment and systems function acceptably within their electromagnetic environment. Specifically, by limiting the unintentional generation, propagation, and reception of electromagnetic energy. This electromagnetic energy when unlimited can cause unwanted effects such as electromagnetic interference (EMI) or physical damage to the equipment.

EMC can be classified into three main classes, emissions, susceptibility, and immunity. Emissions is the generation of electromagnetic energy, whether deliberate or accidental, by some source and its release into the environment Susceptibility is the tendency of electrical equipment to malfunction or break down in the presence of unwanted emissions. This is also known as radio frequency interference (RFI). Immunity is the ability of equipment to function correctly in the presence of RFI, with the discipline of "hardening" equipment being known equally as susceptibility or immunity.

For systems that come in a rack with metal doors, the doors often assist in reducing emissions and increasing immunity for the subcomponents by scattering the energy as it enters or exits the rack such that the emissions are not all focused in one direction. With the introduction of certain rack mount offerings where the server subcomponents (processor drawers, IO drawers, switches, etc.) are offered separately and installed in a customer rack, a problem has been identified due to the fact that many customers do not hang metal doors on their racks. As such the metal doors could no longer be relied upon for scattering the energy to meet EMC standards.

Previously, to address this problem, a statement has been added in the systems user's manual that requires customers to hang metal doors on their rack. However, this led to unhappy customers who did not want to hang doors on their racks for a number of reasons. This approach also requires customers to purchase rack doors if they wish to comply. This results in added costs for the procurement of the systems. Further, there are customers that may either never read the manual or ignore the requirement. This results in them operating systems that do not meet applicable requirements and may put them at risk of being fined or otherwise punished by relevant authorities.

To address this issue, an EMC scattering cape was developed to provide targeted EMC scattering. The scattering cape also helps to ensure that required EMC compliance is met. The EMC scattering cape is designed to scatter the energy due to radiated emissions and/or to provide immunity to a desired area. The EMC scattering cape can be attached to a cable connector or an equipment chassis, which enables the protection without the need for the rack door. The EMC scattering cape can also be configured to flutter in response to airflow. This flutter can cause the energy to scatter. Through the design of the EMC scattering cape, manufacturers of these types of systems are provided with a relatively inexpensive solution that can be implemented to meet various compliance standards. The EMC scattering cape also provides manufacturers a solution that can be implemented in the event that the particular system encounters an EMC failure late in the program's development. This allows for the maintaining of already existing release and shipping schedules. The cape also benefits customers as they do not need to install the rack doors, or have to look to the manual to understand the EMC risks.

Figure 1B:
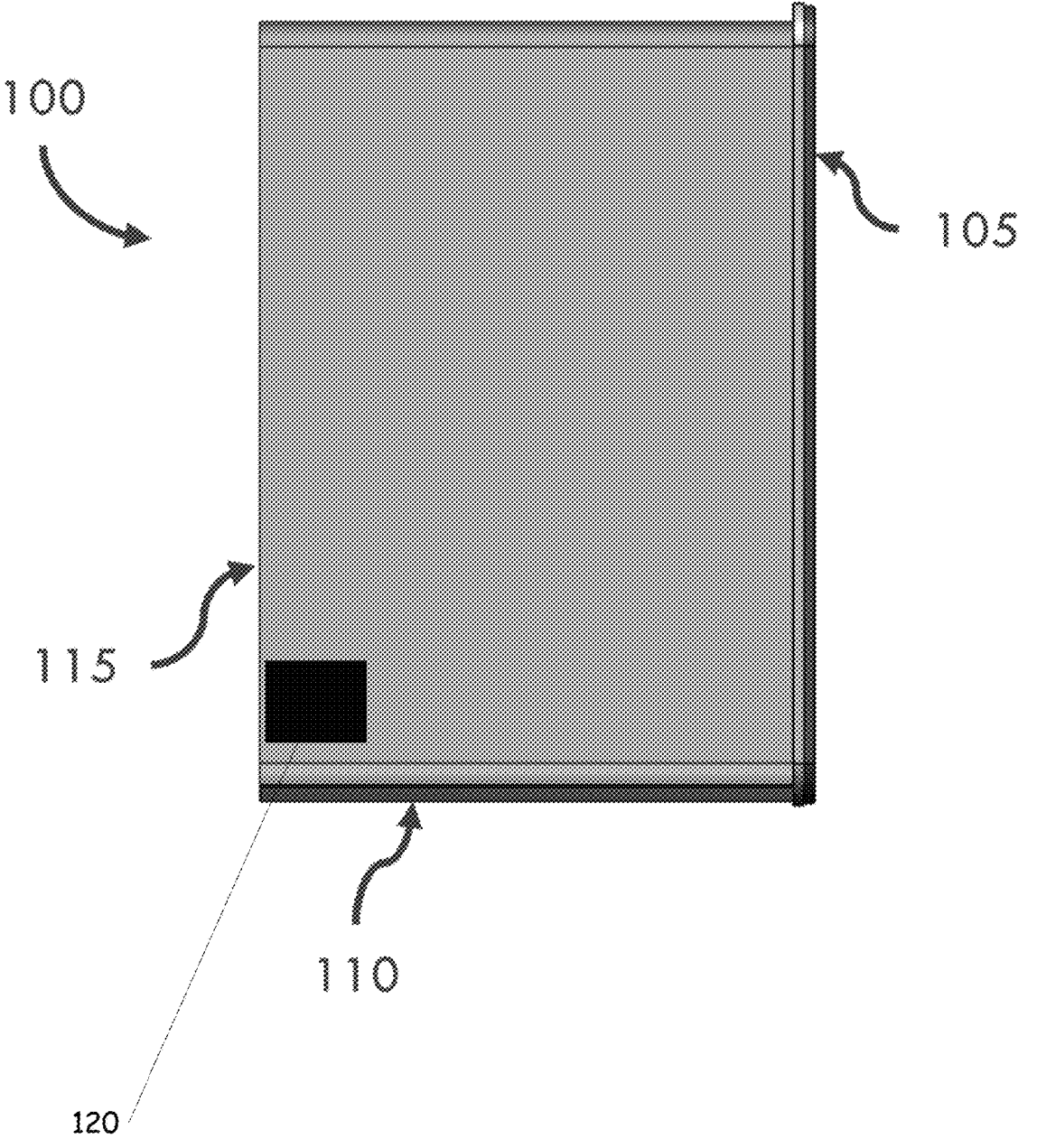
FIG. 1B is a profile view of the EMC scattering apparatus of FIG. 1A according to embodiments of the present disclosure.
Figure 2A:
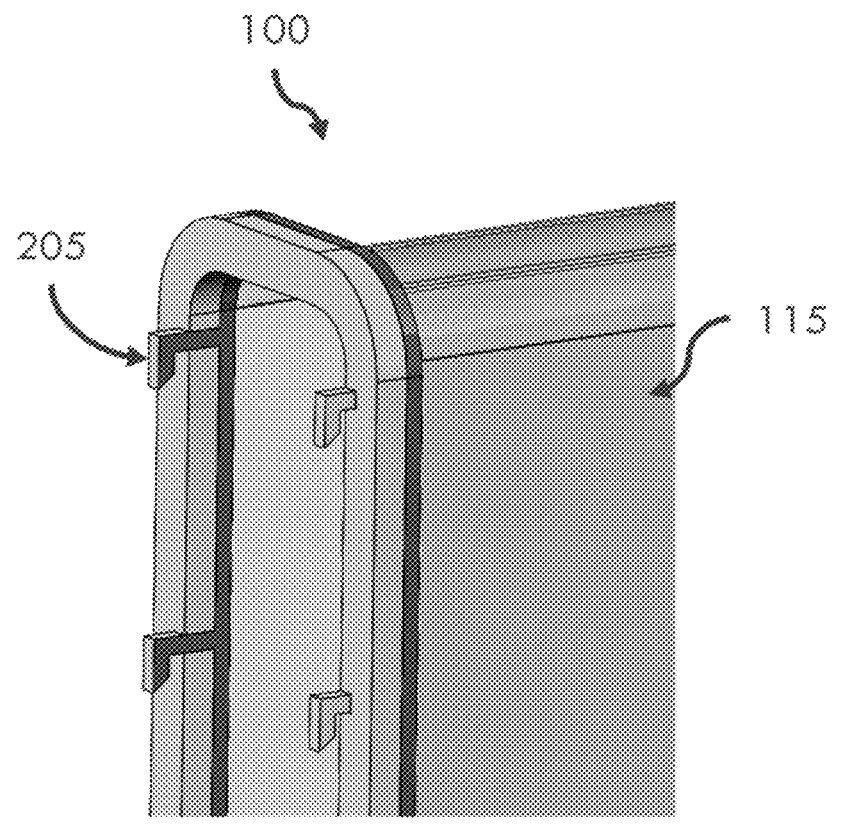
FIG. 2A is an enlarged view of a portion of the attachment component according to embodiments of the present disclosure.
Figure 2B:
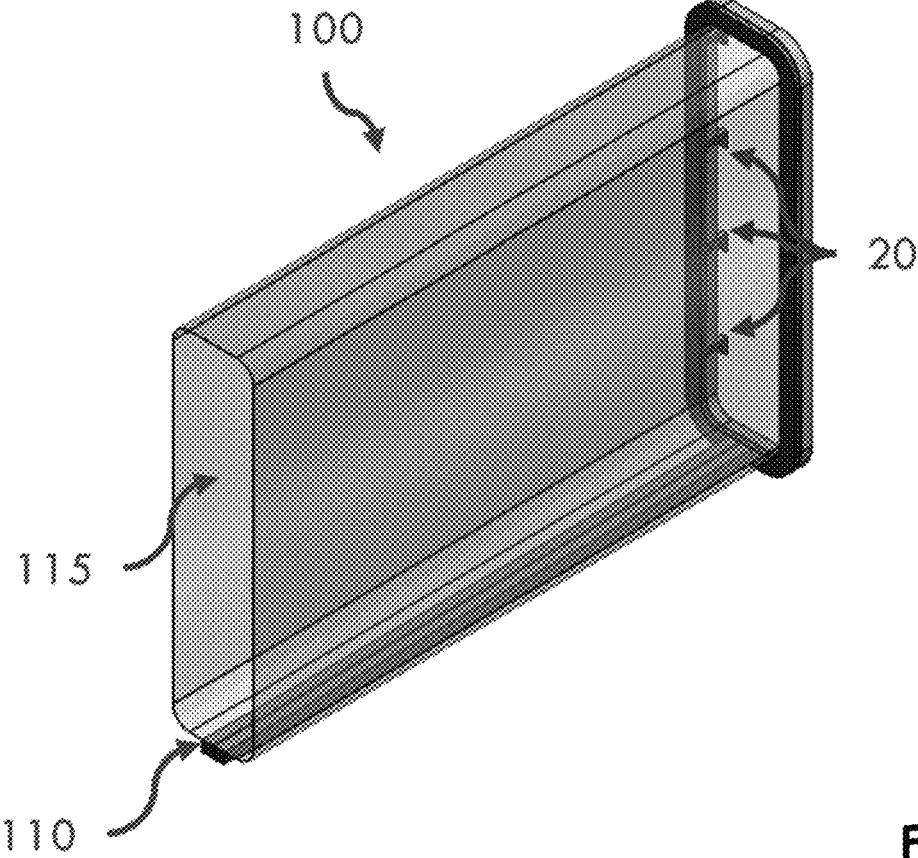
FIG. 2B is a perspective view of the EMC scattering apparatus of FIG. 2A according to embodiments of the present disclosure.
Figure 2C:
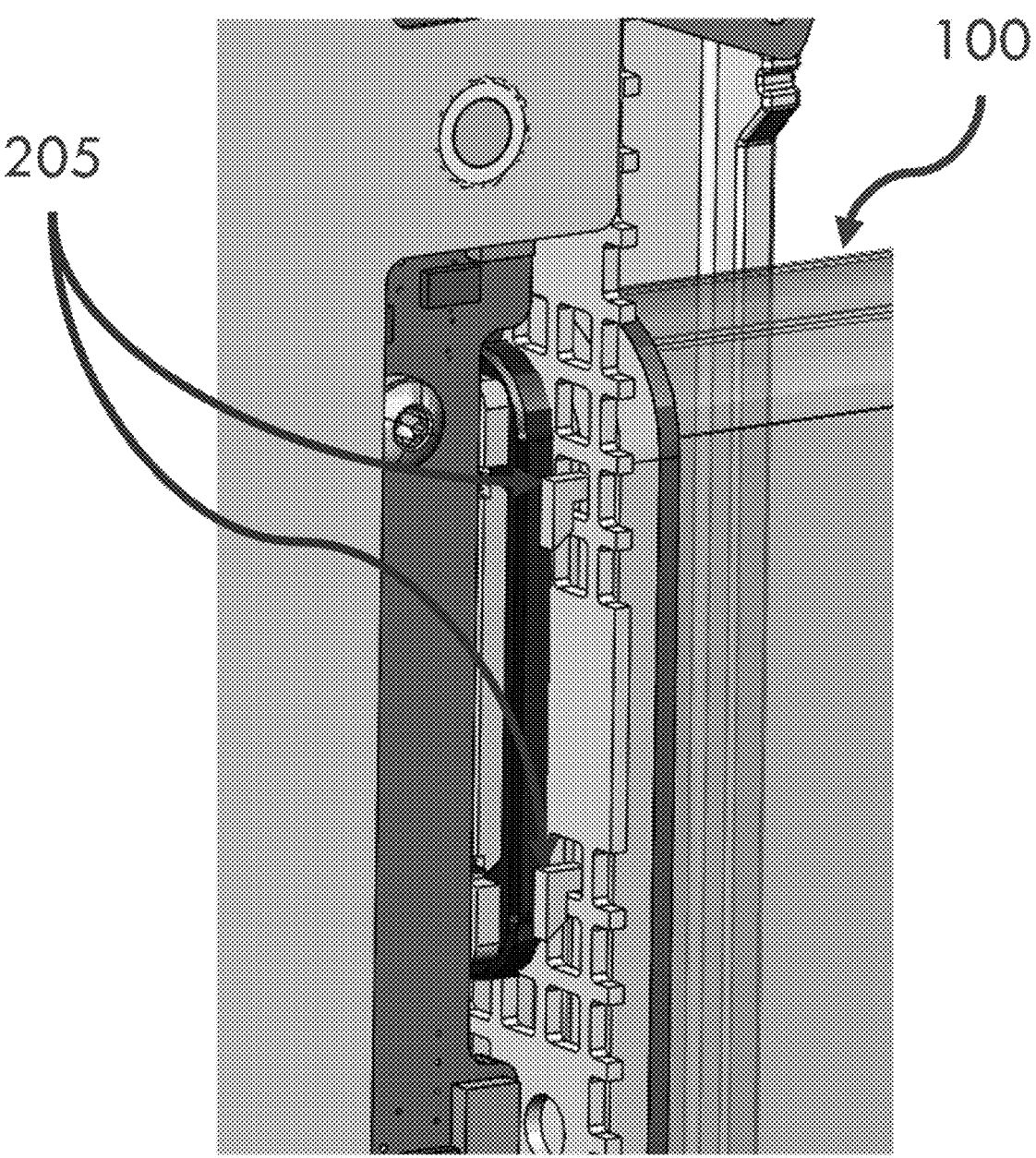
FIG. 2C illustrates the EMC scattering apparatus of FIG. 2A installed in a system according to embodiments of the present disclosure.

FIG. 1A is a perspective view of an EMC scattering apparatus according to embodiments of the present disclosure. FIG. 1B is a profile view of the EMC scattering apparatus of FIG. 1A. FIG. 2A is an enlarged view of a portion of the attachment component according to embodiments of the present disclosure. FIG. 2B is a perspective view of the EMC scattering apparatus of FIG. 2A. FIG. 2C illustrates the EMC scattering apparatus of FIG. 2A installed in a system.

Figure 3:
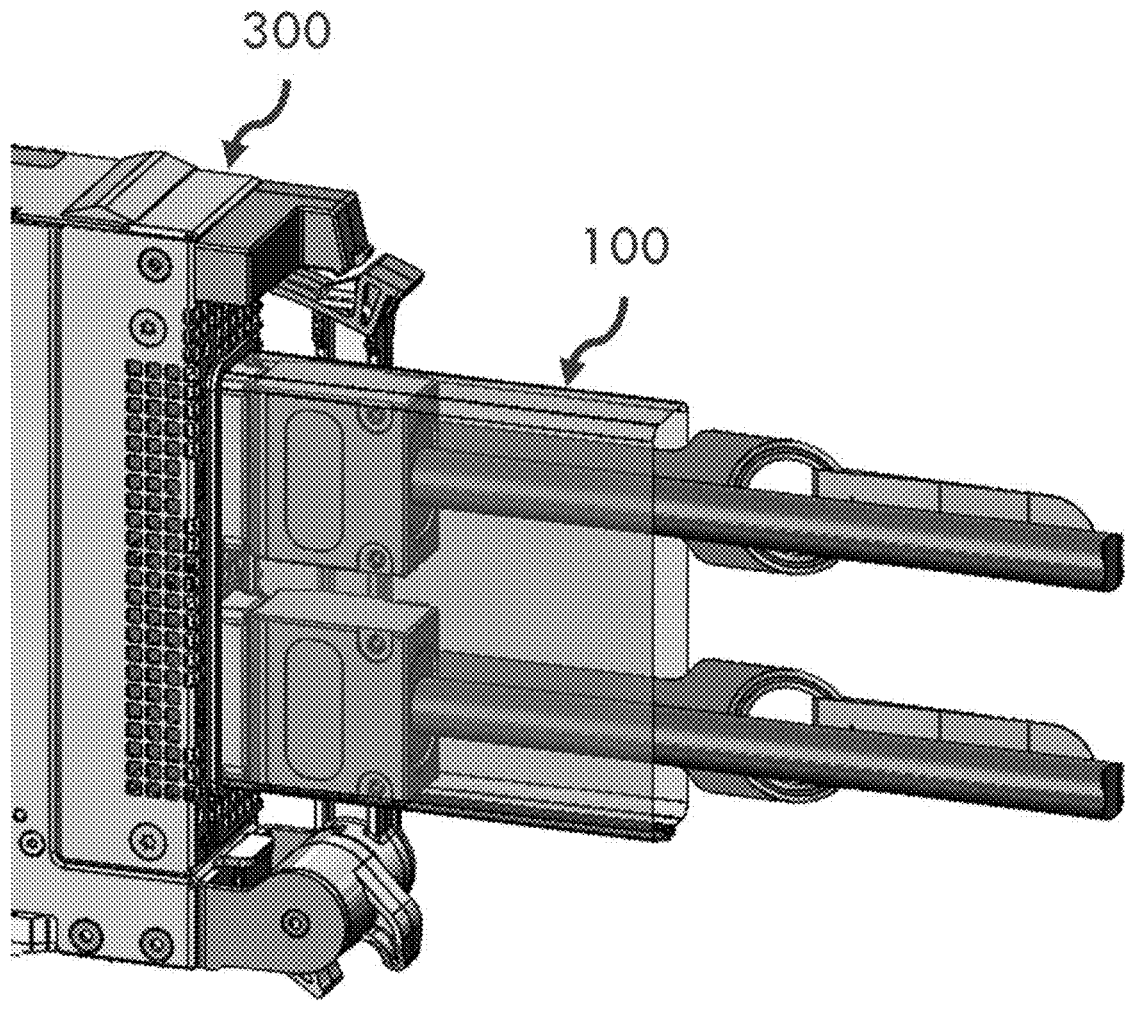
FIG. 3 illustrates the EMC scattering apparatus installed around the connectors of a single input/output card according to embodiments of the present disclosure.
Figure 4:
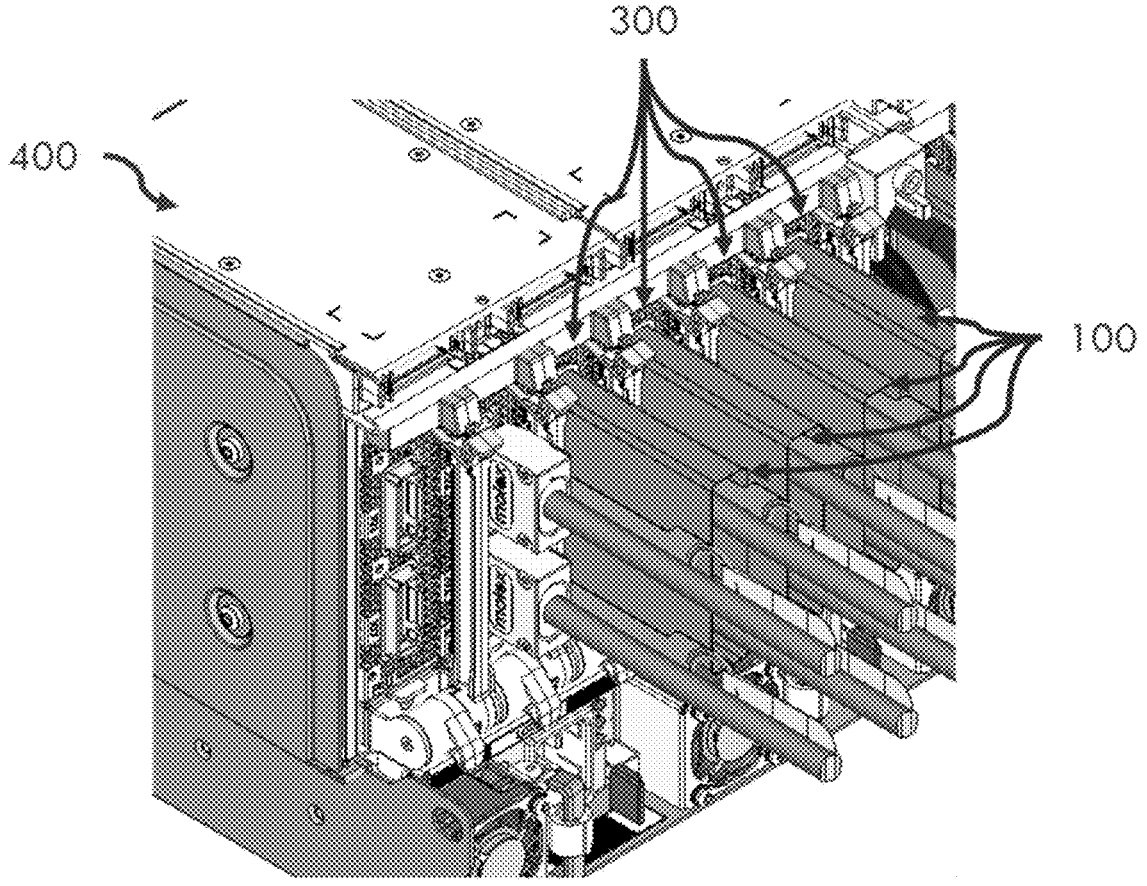
FIG. 4 illustrates multiple EMC scattering apparatuses installed within a drawer or other component according to embodiments of the present disclosure.

FIG. 3 illustrates the EMC scattering apparatus installed around the connectors of a single input/output card 300. FIG. 4 illustrates multiple EMC scattering apparatuses installed within a drawer or other component. For purposes of this discussion FIGS. 1-4 will be discussed together.

The EMC scattering apparatus 100 is an apparatus configured to mitigate EMC radiation and/or provide immunity. The EMC scattering apparatus includes an attachment component 105, a brace 110, and a cape 115. In one or more embodiments, the EMC scattering apparatus 100 is configured to be attached to the rear of a product 400 (e.g., server drawer or subcomponent) where airflow is blowing out, away from the product 400. In some embodiments, the EMC scattering apparatus 100 can be attached to the front of a product 400. However, it should be done so if it is designed so as not to impede inlet airflow for thermal reasons and will not be sucked into fans or other cooling features, and allows for sufficient fluttering of the cape 115 to be achieved.

The attachment component 105 is a feature of the EMC scattering apparatus that is configured to hold the assembly together and permit the attachment of the EMC scattering apparatus 100 to a grounded location on the product 400. The attachment component 105 can be rectangular in shape and configured to attach to a cable connector on an end product 400 or to the chassis of end product 400. This shaping of the attachment component is illustrated in FIGS. 1A and 1B. However, the attachment component does not need to be rectangular, but can be other shapes such as circular, oval, straight, etc. These different shapes can be employed in circumstances where the shape of the area to be protected does not permit the rectangular shape. Further, these shapes can be employed in situations where seams, corners, or openings cause EMC concerns. An example of an implementation of one of these different shapes is illustrated with respect to FIGS. 5A and 5B discussed later in this disclosure.

The attachment component 105 is made from a conductive material such as metal or conductive plastic. The conductive material is provided to ground the EMC scattering apparatus and dissipate any electrical charges that occur. In some embodiments the attachment component is configured to simply snap into place over the portion of the product 400 that is being protected. However, in other embodiments the attachment component can include additional attachment features 205. These attachment features 205 can be, for example, clips, loops, hooks, screws, tabs, or any other means that permits the attachment of the EMC scattering apparatus to the end product 400. An example using hooks to attach the EMC scattering apparatus 100 to the end product 400 is illustrated in FIGS. 2A-2C. In some embodiments, the attachment component 105 includes EMC gaskets or EMC springs. These are provided to help ensure good electrical contact between the EMC scattering apparatus 100 and the corresponding end product 400.

The brace 110 is a component of the EMC scattering apparatus 100 that helps the cape 115 stay extended. The brace 110 attaches to the attachment component 105 and provides a rigid structure to ensure the cape 115 remains extended as it flutters during operation. Although one brace is shown in FIGS. 1A-2C, additional braces can be used. For example, two braces 110 can be attached on opposite ends of the attachment component 105, or four braces 110 can be evenly distributed around the attachment component 105. However, any number of braces 110 can be present depending on the particular needs and geometry. In some embodiments, the brace 110 is not straight. In these embodiments one or more of the braces 110 can be bent or otherwise curved to allow the cape 115 to route around other equipment or obstacles. In this way, the EMC scattering apparatus can be deployed in areas where space is at a premium or the full length of the brace 110 cannot fit.

The cape 115 is a component of the EMC scattering apparatus 100 that is configured to scatter energy due to radiated emissions and/or provide immunity from emissions from other nearby products. The cape 115 is made from a conductive fabric. The conductive fabric is a fabric that includes a conductive material interwoven into the base fabric. The conductive material can include, for example, high shielding fibers like copper, nickel, aluminum, gold, etc. In some embodiments, the material used to form the cape is made from an EMC absorbing material such as Laird Eccosorb® of Laird Technologies Inc of Chesterfield MO or Schlegel BandSorb® of Schlegel Electronic Materials Asia LTD of Hong Kong SAR China.

The cape 115 attaches to the attachment component 105 and the one or more braces 110. The cape 115 is designed to flutter in response to the airflow created by the fans of the end product 400 that the EMC scattering apparatus 100 is attached to (e.g., server drawer or other subcomponent). This fluttering action scatters the radiated emissions and/or provides immunity from emissions from other nearby products. In some embodiments, the conductive fabric includes some internal rigidity built into it. That is, the fabric itself includes material that provides some rigidity, but does not prevent fluttering. This rigidity can help prevent tangling of the cape 115 and/or control the amount of fluttering that occurs. This rigidity may also prevent the need for braces 110 in some embodiments. In some embodiments, the cape 115 can have a weight attached to the end opposite the attachment component 105. This added weight can also help prevent tangling of the cape 115 and/or control the amount of fluttering that occurs. Depending on the particular implementation of the EMC scattering apparatus 100, the length of cape 115 can be adjusted based on the implementation or need. A longer cape 115 will provide more scattering, while a shorter cape 115 will provide less scattering.

In some embodiments, the EMC scattering apparatus 100 can include one or more sensors 120. These sensors 120 can be placed at various locations on the EMC scattering apparatus such as on the end of the brace 110, on the cape 115, or on the attachment component 105. The sensor 120 is configured to determine or indicate the rate at which the cape 115 is fluttering. In some embodiments, the sensors 120 can be a vibration sensor. However, any type of sensor that can determine the rate at which the cape 115 is fluttering can be used. The data from the sensor can be sent to an analysis module on the end product 400 or the EMC scattering apparatus can include a microprocessor and battery to process this data. If the fluttering rate is determined to be outside of a predetermined operating range an alarm or other alert can be generated.

Figures 5A, 5B:
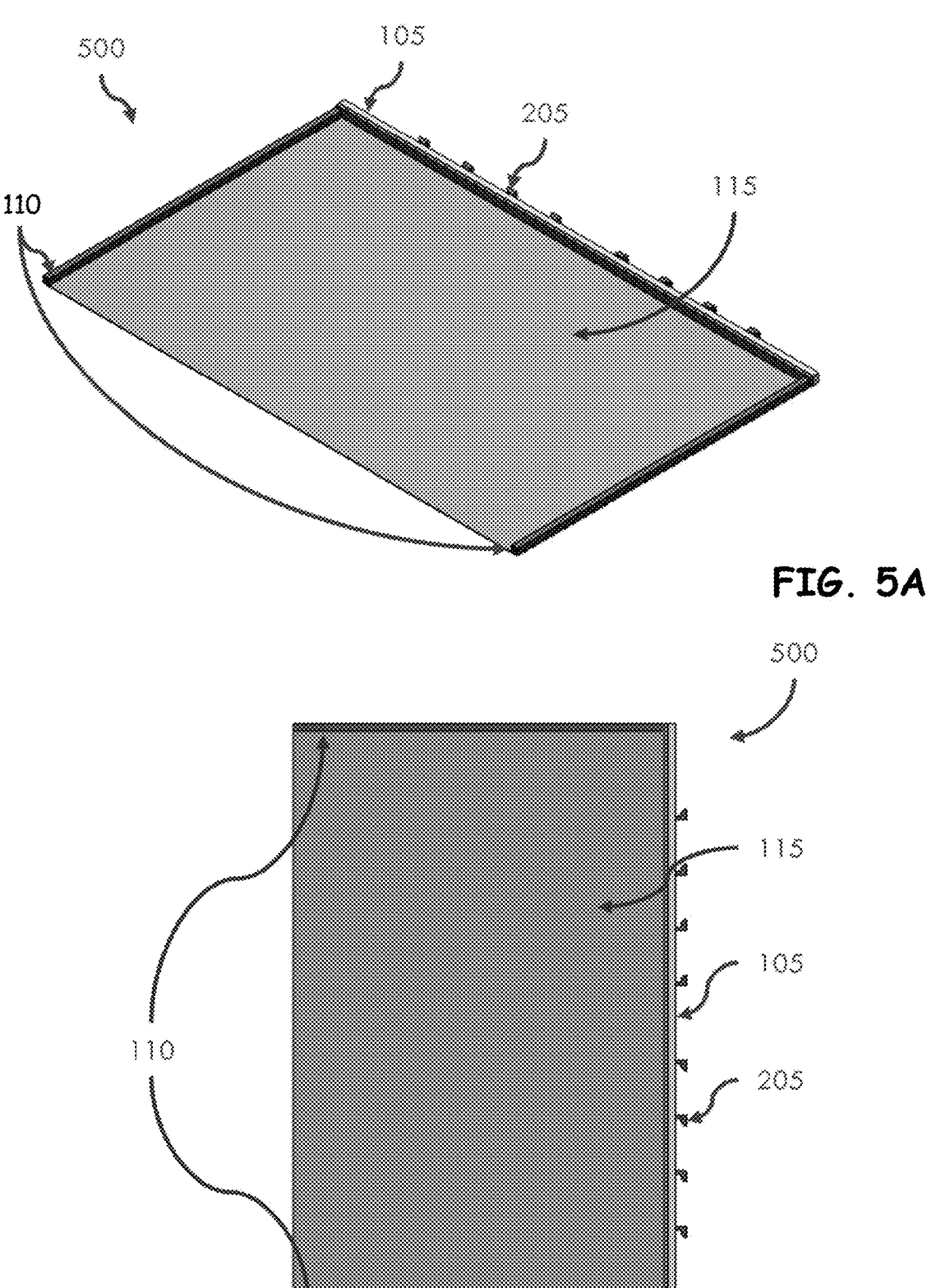
FIGS. 5A and 5B illustrate an alternative embodiment of the EMC scattering apparatus according to embodiments of the present disclosure.

FIGS. 5A and 5B illustrate an alternative embodiment of the EMC scattering apparatus 100 identified by reference number 500. The EMC scattering apparatus 500 includes the same features as the EMC scattering apparatus 100, such as attachment component 105, brace 110, cape 115, and additional attachments 205 (e.g., clip, loops, hooks, screws, etc.) In this embodiment, the EMC scattering apparatus 500 is a straight version. That is, instead of going around the portion being protected, the EMC scattering apparatus 500 only covers one side of the portion being protected. This configuration allows for the EMC scattering apparatus 500 to be attached to an end product 400 near a seam or other opening, where, for example, either only one side needs the protection or the EMC scattering apparatus 500 can only fit on one side. For example, multiple EMC scattering apparatuses 500 could fit between cable connectors of IO cards 300 shown in FIG. 4 or could be aligned horizontally if a top seam above an IO card 300 was causing EMC concerns.

Figure 6:
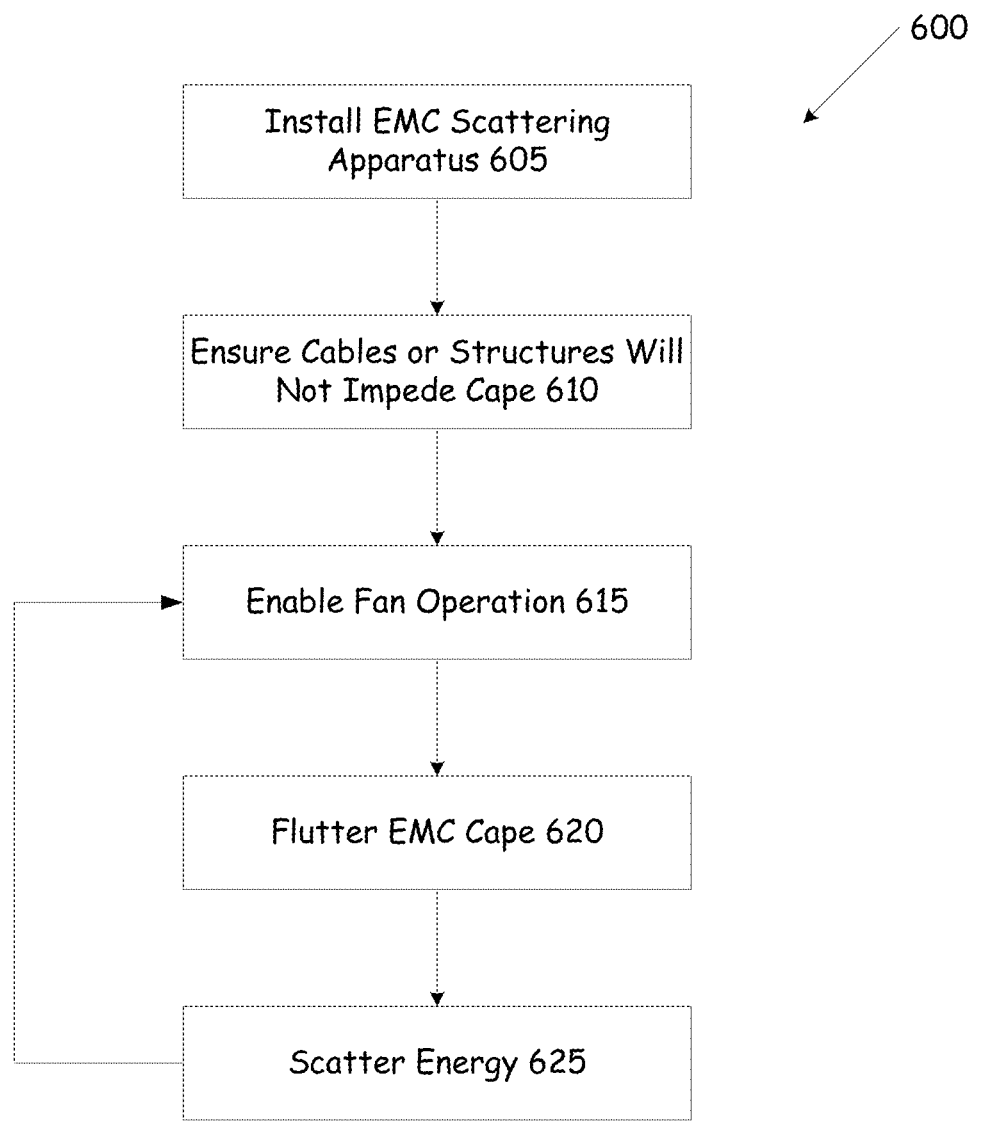
FIG. 6 is a flow diagram illustrating a process for using the EMC scattering apparatus according to embodiments of the present disclosure.

FIG. 6 is a flow diagram illustrating a process 600 for using the EMC scattering apparatus 100. The process 600 starts by installing the EMC scattering apparatus 100 in the desired area of the airflow. This is illustrated at step 605. The desired area can be determined during an EMC compliance test where either radiated emissions or immunity problems are detected. The attachment location on the end product 400 should be connected to the same ground potential as the product EMC scattering apparatus 100. Additionally, airflow must be present in the area where EMC scattering apparatus 100 is attached to cause movement/fluttering of cape 115.

Once the EMC scattering apparatus is installed, a user performing install or service ensures cables or other structures will not impede cape 115 during product operation. This is illustrated at step 610. If there is interference the user can modify the EMC scattering apparatus 100 to permit fitting. This modification can include bending the braces 110 to permit fitment or cutting the length of the cape 115. Once installed and determined to be in a satisfactory position, the end product 400 is activated. This is illustrated at step 615. At this point, the product fans that were already a part of the product are enabled or continue operation. However, in some embodiments a dedicated fan for the EMC scattering apparatus 100 can be provided. In response to the airflow from the fan, the EMC scattering apparatus 100 begins to flutter. This is illustrated at step 620. This fluttering results in the scattering of energy. This is illustrated at step 625. This scattering reduces the radiated emissions that would have been focused in a single direction (if EMC scattering apparatus 100 were not used) and/or to provide immunity. The process then returns to step 615 and repeats until the fan is turned off.

Figure 7:
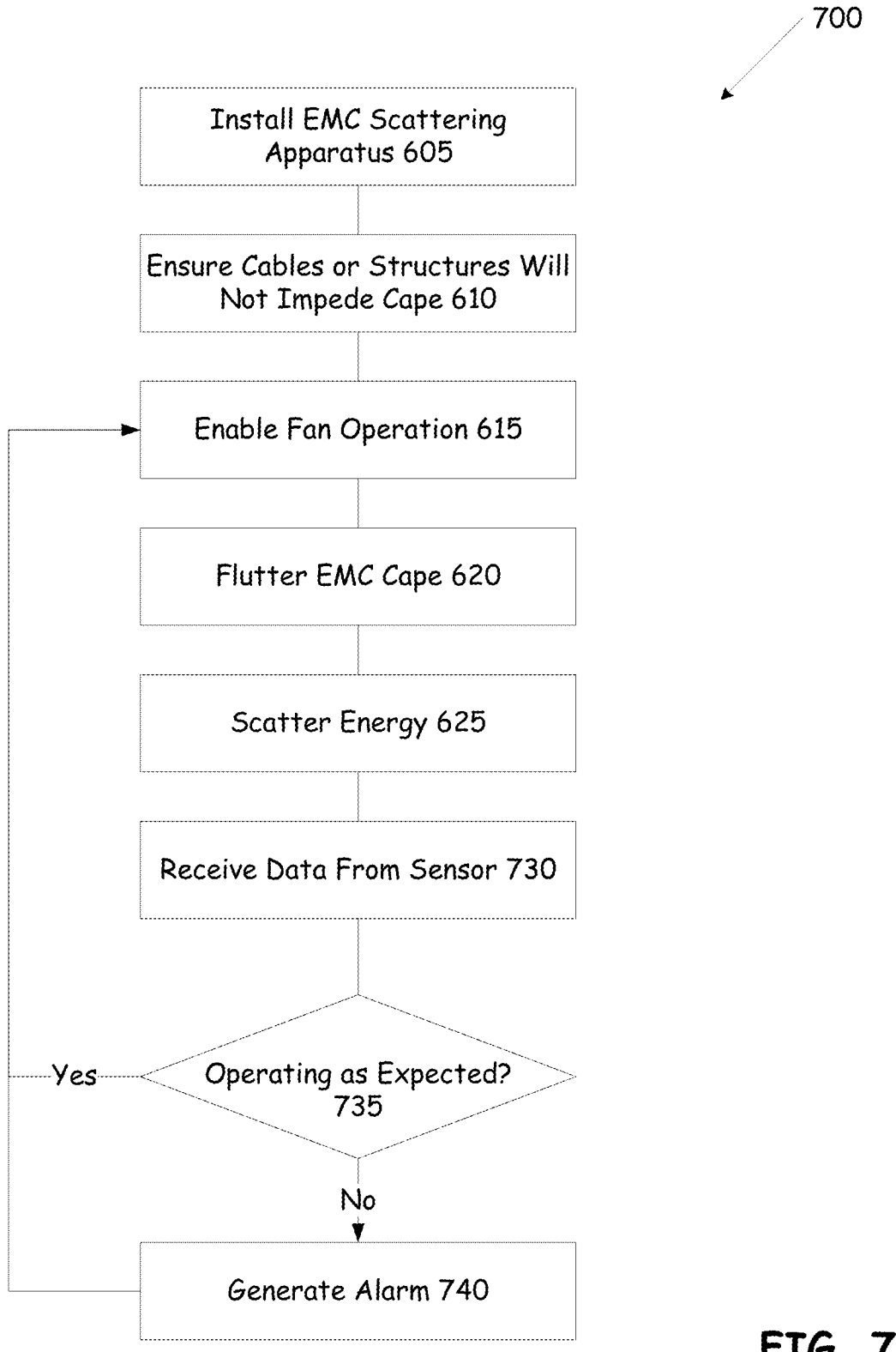
FIG. 7 is a flow diagram illustrating the operation of the EMC scattering apparatus when a sensor is present according to embodiments of the present disclosure.

However, in some embodiments, the EMC scattering apparatus includes one or more sensors 120 that provide information related to the performance of the EMC scattering apparatus. FIG. 7 is a flow diagram illustrating the operation of the EMC scattering apparatus when a sensor 120 is present. This is illustrated as process 700. Continuing from step 625 of FIG. 6, sensor data from the sensor 120 is received. This is illustrated at step 730. The sensor data can be received by a processor on the end product 400 or by a microprocessor on the EMC scattering apparatus 100. The sensor data is then checked. This is illustrated at step 735. At this step, a decision is made as to whether the EMC scattering apparatus 100 is operating as expected. For example, when sensor 120 is a vibration sensor, it measures a vibration rate. It then determines if this rate is within an expected threshold range for a cape 115 fluttering in the presence of a given fan speed.

If operation of EMC scattering apparatus 100 is outside this expected range, then the process generates a warning or notification. This is illustrated at step 740. The warning or notification could be a system warning provided by product 400, a call home event, or other notification to the user of the end product 400 or an operator in the area where the product 400 is operating. In one or more embodiments, operation of product 400 may be altered or limited in response to this determination. For example, the IO card 300 where EMC scattering apparatus 100 is attached can be turned off to prevent further EMC radiation. In one or more embodiments, EMC scattering apparatus 100, can further contain an LED or speaker and give a visual or auditory warning to those in the area.

If operation of EMC scattering apparatus 100 is within acceptable ranges or after executing step 740, the process loops back to step 615 to continue operations. However, in one or more embodiments, after executing step 740, the product operation may end until the issue with EMC scattering apparatus 100 is addressed rather than looping back to step 615.

The present disclosure can be considered as well in view of the following examples.

1. An electromagnetic compatibility (EMC) scattering apparatus comprising an attachment component, a scattering cape, and a brace. The attachment component is configured to permit the EMC scattering apparatus to attach to a second object such as a drawer, cable outlet, cable connector, etc. The scattering cape is attached to the attachment component and is configured to scatter energy emitted from the second object by fluttering in response to airflow from the second object. The brace is connected to the attachment component, the brace is configured to keep the scattering cape in an extended position. The brace can also be attached to the scattering cape.

2. The EMC scattering apparatus of example 1 wherein the scattering cape is further configured to provide immunity to an environment surrounded by the cape.

3. The EMC scattering apparatus of example 1 or 2 wherein the attachment component includes an attachment means selected from the group consisting of clips, loops, hooks, and screws.

4. The EMC scattering apparatus of any of the previous examples wherein at least a portion of the attachments means is electrically conductive.

5. The EMC scattering apparatus of any of the previous examples wherein the scattering cape is comprised of a conductive fabric.

6. The EMC scattering apparatus of any of the previous examples wherein the scattering cape is comprised of an EMC absorbing material.

7. The EMC scattering apparatus of any of the previous examples further comprising two or more braces attached to the attachment component.

8. The EMC scattering apparatus of any of the previous examples wherein the scattering cape is comprised of a material that provides internal rigidity.

9. The EMC scattering apparatus of any of the previous examples further including a weight disposed on the scattering cape at an end opposite the attachment component to prevent tangling of the cape.

10. The EMC scattering apparatus of any of the previous examples wherein the scattering cape encloses a component of the second object.

11. The EMC scattering apparatus of any of the previous examples further including a sensor. The sensor is located on the apparatus to determine a flutter rate of the scattering cape. The sensor further sends the flutter rate to a microprocessor to determine if the flutter rate is within a predetermined operating range.

12. The EMC scattering apparatus of any of the previous examples wherein the microprocessor is disposed on the EMC scattering cape apparatus.

13. The EMC scattering apparatus of any of the previous examples wherein the sensor is disposed on the scattering cape.

14. The EMC scattering apparatus of any of the previous examples wherein the sensor is disposed at an end of the brace opposite the attachment component.

15. A method for operation of an electromagnetic compatibility (EMC) scattering apparatus. The method begins by attaching the EMC scattering apparatus to a product in an area clear of obstructions. Next the fans on the product are enabled. This causes airflow to flow through the cape. In response to the airflow the scattering cape of the EMC scattering apparatus flutters so as to scatter energy emitted from the product.

16. The method of example 15, wherein the EMC scattering apparatus is attached to the same ground potential that is used on the product.

17. The method of example 15 or 16, wherein the EMC scattering apparatus is attached around a connector on the product.

18. The method of any one of the examples 15-17, wherein the EMC scattering apparatus is attached in an area with airflow from the product.

19. The method of any one of the examples 15-18, wherein the EMC scattering apparatus contains a sensor. The method further measures a fluttering rate of the EMC scattering apparatus. Based on this fluttering rate, a microprocessor determines whether the fluttering rate is within an expected range.

20. The method of any of the examples 15-19, wherein the EMC scattering apparatus connects to a product that provides power and wherein there is a communication path to said product.

21. The method of any of the examples 15-20, wherein operation of the product is altered based on communication of abnormal operation of the EMC scattering cape apparatus.

22. The method of any of the examples 15-21, wherein the fluttering provides immunity to a component of the product surrounded by the EMC scattering apparatus, by scattering energy within the environment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. An electromagnetic compatibility (EMC) scattering apparatus comprising:
   an attachment component configured to permit the EMC scattering apparatus to attach to a second object;
   a scattering cape attached to the attachment component configured to scatter energy emitted from the second object, wherein the scattering cape is configured to flutter in response to airflow; and
   a brace connected to the attachment component, the brace configured to keep the scattering cape in an extended position.

2. The EMC scattering apparatus of claim 1, wherein the scattering cape is further configured to provide immunity to an environment surrounded by the scattering cape.

3. The EMC scattering apparatus of claim 1, wherein the attachment component includes an attachment means selected from the group consisting of clips, loops, hooks, and screws.

4. The EMC scattering apparatus of claim 1, wherein at least a portion of the attachment component is electrically conductive.

5. The EMC scattering apparatus of claim 1, wherein the scattering cape is comprised of a conductive fabric.

6. The EMC scattering apparatus of claim 1, wherein the scattering cape is comprised of an EMC absorbing material.

7. The EMC scattering apparatus of claim 1, further comprising two or more braces attached to the attachment component.

8. The EMC scattering apparatus of claim 1, wherein the scattering cape is comprised of a material that provides internal rigidity.

9. The EMC scattering apparatus of claim 1, further comprising:
   a weight disposed on the scattering cape at an end opposite the attachment component.

10. The EMC scattering apparatus of claim 1, wherein the scattering cape encloses a component of the second object.

11. The EMC scattering apparatus of claim 1, further comprising:

a sensor disposed on the apparatus configured to determine a flutter rate of the scattering cape and send the flutter rate to a microprocessor configured to determine if the flutter rate is within a predetermined operating range.

12. The EMC scattering apparatus of claim 11, wherein the microprocessor is disposed on the EMC scattering cape apparatus.

13. The EMC scattering apparatus of claim 11, wherein the sensor is disposed on the scattering cape.

14. The EMC scattering apparatus of claim 11, wherein the sensor is disposed at an end of the brace opposite the attachment component.

15. A method for operation of an electromagnetic compatibility (EMC) scattering apparatus, the method comprising:
   attaching the EMC scattering apparatus to a product in an area clear of obstructions; and
   enabling fans on the product that cause fluttering of a scattering cape of the EMC scattering apparatus to scatter energy emitted from the product.

16. The method of claim 15, wherein the EMC scattering apparatus is attached to a ground potential that is used on the product.

17. The method of claim 15, wherein the EMC scattering apparatus is attached around a connector on the product.

18. The method of claim 15, wherein the EMC scattering apparatus is attached in an area with airflow from the product.

19. The method of claim 15, wherein the EMC scattering apparatus contains a sensor, and further comprises;
   measuring a fluttering rate of the EMC scattering apparatus; and
   determining whether the fluttering rate is within an expected range.

20. The method of claim 15, wherein the EMC scattering apparatus connects to a product that provides power and wherein there is a communication path to said product.

* * * * *